(12) United States Patent
Heo et al.

(10) Patent No.: US 11,908,230 B2
(45) Date of Patent: Feb. 20, 2024

(54) FINGERPRINT SENSOR AND ELECTRONIC DEVICE COMPRISING FINGERPRINT SENSOR

(71) Applicant: SAMSUNG ELECTRONICS CO., LTD., Suwon-si (KR)

(72) Inventors: Jihun Heo, Suwon-si (KR); Hyunwoo Kim, Suwon-si (KR); Jihoon Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/984,784

(22) Filed: Nov. 10, 2022

(65) Prior Publication Data
US 2023/0072248 A1    Mar. 9, 2023

Related U.S. Application Data

(63) Continuation of application No. PCT/KR2021/005953, filed on May 12, 2021.

(30) Foreign Application Priority Data

May 12, 2020    (KR) .................. 10-2020-0056738

(51) Int. Cl.
*G06V 40/13* (2022.01)
*G06F 3/041* (2006.01)
(Continued)

(52) U.S. Cl.
CPC ........ *G06V 40/1318* (2022.01); *G06F 3/0412* (2013.01); *G06F 3/0441* (2019.05);
(Continued)

(58) Field of Classification Search
CPC ........... G06V 40/1318; G06V 40/1306; G06V 40/1329; G06F 3/0412; G06F 3/04164;
(Continued)

(56) References Cited

U.S. PATENT DOCUMENTS

| 9,052,784 B2 | 6/2015 | Iwamoto et al. |
| 10,380,396 B2 | 8/2019 | Jung et al. |

(Continued)

FOREIGN PATENT DOCUMENTS

| CN | 102591539 | 7/2012 |
| KR | 10-2017-0125778 | 11/2017 |

(Continued)

*Primary Examiner* — Antonio Xavier
(74) *Attorney, Agent, or Firm* — Nixon & Vanderhye P.C.

(57) ABSTRACT

An electronic device may include: a display device; a battery; a digitizer positioned between at least the display device and the battery and including a first circuit board; a fingerprint sensor including a second circuit board and a third circuit board; and a processor electrically connected to the display device, the digitizer, and the fingerprint sensor. The first circuit board may include a first conductive pattern for recognizing an input device, the second circuit board may include a second conductive pattern for recognizing the input device, the third circuit board may include a third conductive pattern for recognizing a fingerprint, and the first conductive pattern and the second conductive pattern may be electrically connected. Various other embodiments that can be recognized through the specification are also possible.

15 Claims, 16 Drawing Sheets

(51) Int. Cl.
  *G06F 3/044* (2006.01)
  *H01L 27/146* (2006.01)
(52) U.S. Cl.
  CPC ...... *G06F 3/04164* (2019.05); *G06V 40/1306*
    (2022.01); *H01L 27/14636* (2013.01); *H01L*
    *27/14678* (2013.01); *G06F 2203/04107*
    (2013.01)
(58) Field of Classification Search
  CPC ......... G06F 3/0441; G06F 2203/04107; G06F
    3/044; G06F 3/046; G06F 3/041; H01L
    27/14636; H01L 27/14678; H01L
    27/14618
  See application file for complete search history.

(56) References Cited

U.S. PATENT DOCUMENTS

| | | | |
|---|---|---|---|
| 10,656,799 B2 * | 5/2020 | Takesue | G06F 1/1643 |
| 10,684,650 B2 | 6/2020 | Sim et al. | |
| 10,824,840 B2 | 11/2020 | Song et al. | |
| 10,929,637 B2 | 2/2021 | Kim et al. | |
| 10,956,764 B2 | 3/2021 | Kim et al. | |
| 10,983,558 B2 | 4/2021 | Kim et al. | |
| 10,990,792 B2 | 4/2021 | Park et al. | |
| 11,334,114 B2 | 5/2022 | Kim et al. | |
| 2012/0139561 A1 | 6/2012 | Iwamoto et al. | |
| 2016/0132712 A1 * | 5/2016 | Yang | G06V 40/1318 348/77 |
| 2017/0300736 A1 * | 10/2017 | Song | G06V 40/1312 |
| 2018/0039815 A1 | 2/2018 | Jung et al. | |
| 2018/0211078 A1 * | 7/2018 | Lillie | G06V 40/1306 |
| 2018/0293420 A1 * | 10/2018 | Kim | G06F 3/0414 |
| 2018/0314379 A1 * | 11/2018 | Shen | G06V 40/1318 |
| 2018/0341290 A1 * | 11/2018 | Sim | G06F 1/1658 |
| 2019/0251320 A1 | 8/2019 | Kim et al. | |
| 2020/0057902 A1 | 2/2020 | Kim et al. | |
| 2021/0042495 A1 | 2/2021 | Song et al. | |
| 2021/0240964 A1 | 8/2021 | Park et al. | |
| 2022/0207909 A1 * | 6/2022 | Raguin | G06V 10/143 |
| 2022/0253095 A1 | 8/2022 | Kim et al. | |

FOREIGN PATENT DOCUMENTS

| | | |
|---|---|---|
| KR | 10-2018-0015371 | 2/2018 |
| KR | 10-2018-0114796 | 10/2018 |
| KR | 10-2018-0114797 | 10/2018 |
| KR | 10-2018-0127705 | 11/2018 |
| KR | 10-2018-0130151 | 12/2018 |
| KR | 10-2019-0053367 | 5/2019 |
| KR | 10-2019-0098534 | 8/2019 |
| KR | 10-2019-0098537 | 8/2019 |

* cited by examiner

FINGERPRINT SENSOR AND ELECTRONIC DEVICE COMPRISING FINGERPRINT SENSOR

CROSS-REFERENCE TO RELATED APPLICATIONS

This application is a continuation of International Application No. PCT/KR2021/005953 filed on 12 May 2021, designating the United States, in the Korean Intellectual Property Receiving Office, and claiming priority to Korean Patent Application No. KR 10-2020-0056738, filed on May 12, 2020, in the Korean Intellectual Property Office, the disclosures of which are all hereby incorporated by reference herein in their entireties.

BACKGROUND

Field

Certain example embodiments relate to a fingerprint sensor and/or an electronic device including the fingerprint sensor.

Description of Related Art

A fingerprint on display (FoD) fingerprint sensor identifies a user using a fingerprint when the user touches a display with a finger. An ultrasonic fingerprint sensor that detects a fine air layer gap between a finger and a sensor contact surface and an optical fingerprint sensor that obtains a fingerprint image reflected by light and compares the fingerprint image with fingerprint information are exemplified as a typical FoD fingerprint sensor.

In order to embed a fingerprint sensor in a rear surface of a display, a hole may be formed through a plurality of layers (e.g., an embo layer, a sponge layer, an adhesive layer, a shielding layer, and/or a digitizer) on the rear surface of the display, and the fingerprint sensor may be attached to a position corresponding to the hole.

SUMMARY

In the case in which, to embed the fingerprint sensor in the rear surface of the display, the hole is formed through the plurality of layers (e.g., an embo layer, a sponge layer, an adhesive layer, a shielding layer, and/or a digitizer) on the rear surface of the display and the fingerprint sensor is attached to the position corresponding to the hole, performance degradation may occur for the portion through which the hole is formed.

For example, in a case in which a hole is formed through a digitizer, degradation in the recognition performance of an input device (e.g., s digital pen) may occur in the corresponding hole portion.

For example, in a case of an optical fingerprint sensor, due to a structure including a predetermined gap between a display and the fingerprint sensor and between the fingerprint sensor and a battery, it may be difficult to attach the fingerprint sensor to a rear surface of the display, and it may be impossible to cover a hole of a digitizer using an additional flexible printed circuit board after the fingerprint sensor is attached to the rear surface of the display.

Certain example embodiments provide an electronic device including a fingerprint sensor embedded in a rear surface of a display without affecting the performance of a digitizer.

An electronic device according to an example embodiment may include a display device, a battery, a digitizer that is located between the display device and the battery and that includes a first circuit board, a fingerprint sensor including a second circuit board and a third circuit board, and a processor electrically connected to the display device, the digitizer, and the fingerprint sensor. The first circuit board may include a first conductive pattern for recognition of an input device, the second circuit board may include a second conductive pattern for recognition of the input device, the third circuit board may include a third conductive pattern for recognition of a fingerprint, and the first conductive pattern and the second conductive pattern may be electrically connected.

A fingerprint sensor according to an example embodiment includes a photo sensor, a first circuit board, and a second circuit board. The first circuit board may include a first conductive pattern for recognition of an input device, and the second circuit board may include a second conductive pattern for recognition of a fingerprint.

An electronic device according to an example embodiment may include a display device, a battery, a heat radiating layer located between the display device and the battery, a fingerprint sensor including a circuit board, and a processor electrically connected to the display device and the fingerprint sensor. The circuit board may include a conductive pattern for recognition of a fingerprint, the circuit board may include an opening through which at least a portion of a metal layer included in the circuit board is exposed, and the metal layer exposed through the opening may be electrically connected with the heat radiating layer.

An electronic device according to an example embodiment may include a display device, a battery, a digitizer that is located between the display device and the battery and that may include a first circuit board and a second circuit board, a fingerprint sensor including a photo sensor, and a processor electrically connected to the display device, the digitizer, and the fingerprint sensor. The first circuit board may include a first conductive pattern for recognition of an input device, the second circuit board may include a second conductive pattern for recognition of a fingerprint, and the second conductive pattern and the photo sensor are electrically connected.

According to the example embodiments, the fingerprint sensor may be embedded in the rear surface of the display without substantially affecting the performance of the digitizer, and the electronic device including the fingerprint sensor may be provided.

In addition, the disclosure may provide various effects that are directly or indirectly recognized.

BRIEF DESCRIPTION OF DRAWINGS

The above and other aspects, features, and advantages of certain example embodiments will be more apparent from the following detailed description, taken in conjunction with the accompanying drawings, in which:

FIG. 2 illustrates a portion of a stacked structure of the electronic device according to an example embodiment.

FIG. 11 illustrates a portion of a stacked structure of the electronic device according to an example embodiment.

FIG. 12 illustrates a portion of a stacked structure of the electronic device according to an example embodiment.

With regard to description of the drawings, identical or similar reference numerals may be used to refer to identical or similar components.

DETAILED DESCRIPTION

Hereinafter, various example embodiments may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
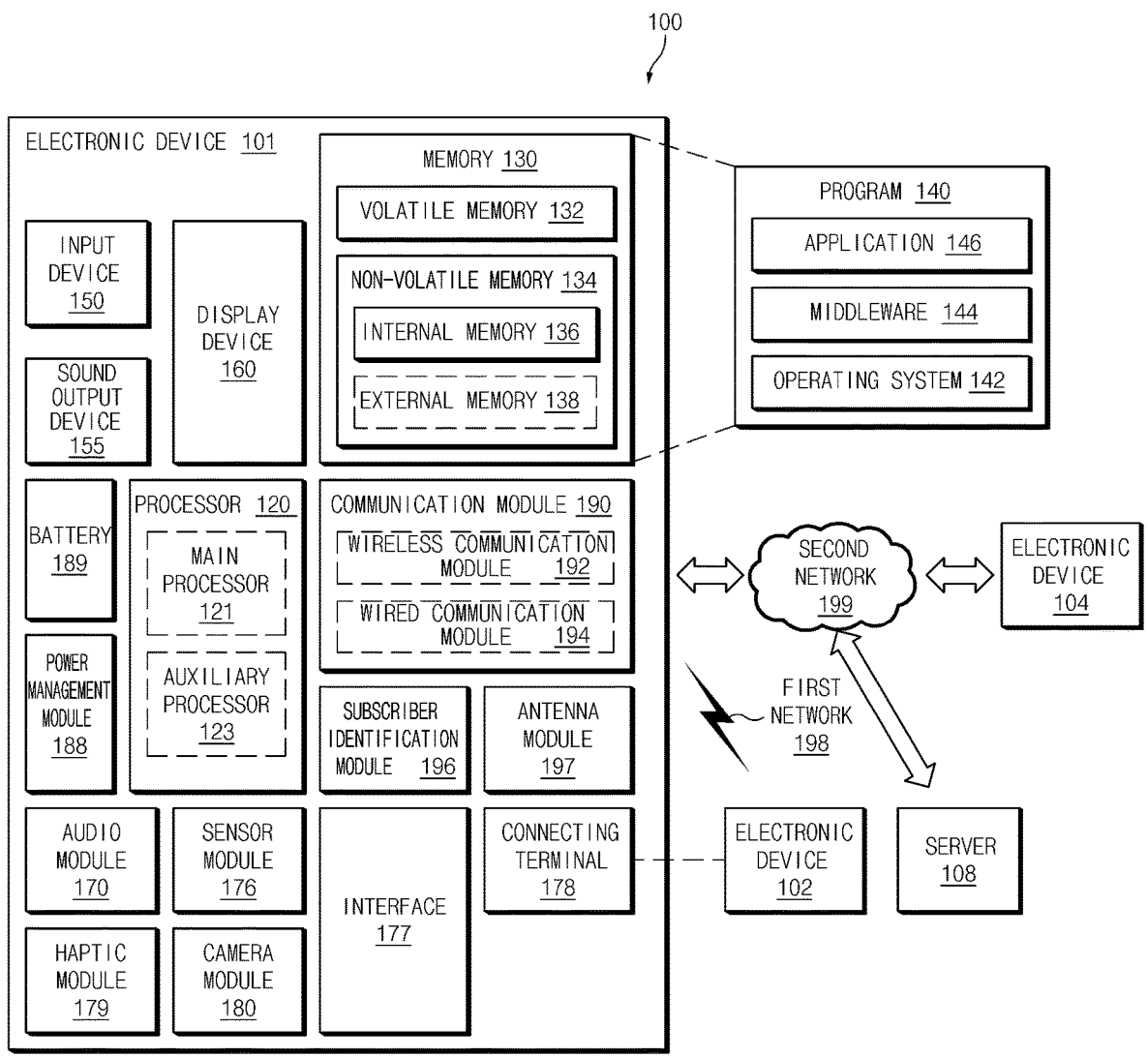
FIG. 1 is a block diagram illustrating an electronic device 101 in a network environment 100 according to various example embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module(SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an example embodiment, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via at least a third element.

As used in connection with various example embodiments, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC). Thus, each "module" herein may comprise circuitry.

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120, comprising processing circuitry) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various example embodiments may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Hereinafter, an electronic device according to an example embodiment will be described with reference to FIG. 2.

Figure 2:
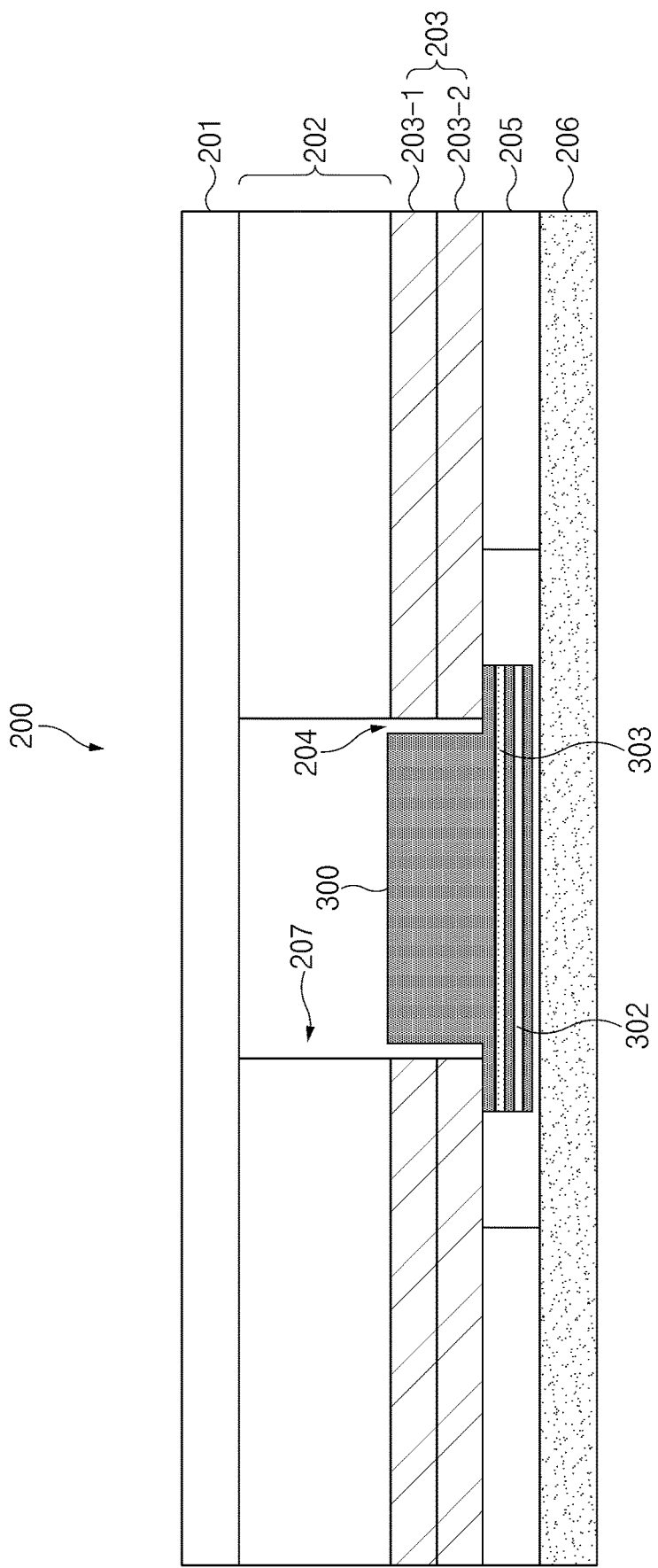
FIG. 2 is a sectional view of an electronic device, where

FIG. 2 is a sectional view of the electronic device 200, where FIG. 2 illustrates a portion of a stacked structure of the electronic device according to an example embodiment.

Referring to FIG. 2, the electronic device 200 (e.g., the electronic device 101 of FIG. 1) may include a display device 201 (e.g., the display device 160 of FIG. 1), a protective layer 202, a digitizer 203, a fingerprint sensor 300, a heat radiating layer 205, and a battery 206 (e.g., the battery 189 of FIG. 1).

A plurality of lines and a plurality of pixels may be disposed in the display device 201. For example, a plurality of gate lines and a plurality of data lines may be disposed in the display device 160, and the gate lines and the data lines may cross each other. The pixels may emit light, based on signals supplied from the gate lines and the data lines.

The battery 206 may supply power to at least one component of the electronic device 200. According to an embodiment, the battery 206 may include at least one of a primary cell that is not rechargeable, a secondary cell that is rechargeable, or a fuel cell.

The digitizer 203 may be located between the display device 201 and the battery 206. The digitizer 203 may be a panel for sensing an input of an input device (not illustrated). According to an embodiment, the digitizer 203 may include a first flexible printed circuit board (FPCB) 203-1 and a shielding sheet 203-2. For example, the first flexible printed circuit board 203-1 may be a sheet (e.g., a WACOM sheet) for recognizing an electrical signal generated from a user input device such as a stylus pen. The shielding sheet 203-2 may prevent or reduce interference between components (e.g., a display device module, a printed circuit board, and an electro-magnetic induction panel) included in the electronic device 200 due to electro-magnetic fields generated from the components. The shielding sheet 203-2 may block the electro-magnetic fields generated from the components, thereby enabling an input signal from the input device to be accurately transferred to the digitizer 203. For example, the shielding sheet 203-2 may be a magnetic metal powder (MMP) sheet, a copper (Cu) sheet, or a metal plate (SUS).

According to various embodiments, a flexible printed circuit board (FPCB) disposed in the disclosure may be a printed circuit board (PCB). For example, the digitizer 203 may include the first printed circuit board (PCB) 203-1 and the shielding sheet 203-2. In this disclosure, a printed circuit board may be used with the meaning of a circuit board. For example, a first printed circuit board, a second printed circuit board, and a third printed circuit board may be referred to as a first circuit board, a second circuit board, and a third circuit board, respectively.

According to an embodiment, the digitizer 203 may identify various pieces of information including coordinates corresponding to the position of the input device (not illustrated), a tilt of the input device, or pressure of the input device. The digitizer 203 may receive an electro-magnetic signal using a first conductive pattern included in the first FPCB 203-1. The electro-magnetic signal may refer to an electro-magnetic signal output from the input device. The digitizer 203 may identify various pieces of information including the tilt of the input device, the pressure of the input device, or the position of the input device on the display 201, based on the electro-magnetic signal output from the input device. According to an embodiment, the first conductive pattern of the digitizer 203 may form a corresponding current (or, voltage) in response to a change in the intensity of a magnetic field generated by the electro-magnetic signal transmitted from the input device. For example, the first conductive pattern may be formed of a plurality of conductive layers. The first conductive pattern may include a second plurality of conductive lines disposed perpendicular to a plurality of first conductive lines.

According to an embodiment, the input device (not illustrated) may collectively refer to devices that can be used to input information to the electronic device. A separate resonance circuit may be embedded in the input device and may operate in conjunction with the digitizer 203 included in the electronic device 200. The input device may include at least one of an electro-magnetic resonance (EMR) type, an active electrical stylus (AES) type, or an electric coupled resonance (ECR) type. According to an embodiment, the digitizer 203 may sense the position of the input device on the display device 201 by using a method of sensing, by the digitizer 203, the electro-magnetic signal generated from the input device. According to an embodiment, the input device may receive the electro-magnetic signal generated from the digitizer 203 and may modify and output the received electro-magnetic signal. At this time, the digitizer 203 may sense the position of the input device on the display by receiving the modified electro-magnetic signal.

According to an embodiment, the input device may have the form of a digital pen and may include an electrode in a pen tip. According to an embodiment, the electronic device 200 may sense an input position, based on a change in capacitance in a touch panel by access of the electrode located in the pen tip of the input device. According to an embodiment, the input device may be inserted into or detached from the housing through a hole formed in a side surface of the housing of the electronic device 200 and may include a button for facilitating detachment. The input device may be used separately from the electronic device 200. According to an embodiment, the input device may be attached to the outside of the electronic device 200.

According to an embodiment, in the digitizer 203, a first hole 204 may be located in a position corresponding to the fingerprint sensor 300. Since the first conductive pattern cannot be located in the region in which the first hole 204 is located, the first conductive pattern of the digitizer 203 may be disposed to avoid the first hole 204.

The protective layer 202 may be located between the display device 201 and the digitizer 203. The protective layer 202 may include at least one of a buffer layer (e.g., a cushion layer or a sponge layer) for absorbing impact or a light blocking layer (e.g., a black sheet or a light blocking member layer of a black printed layer) for blocking light. The protective layer 202 may absorb external impact to protect other components inside the electronic device 200. The protective layer 202 may be configured in an integral form in which the buffer layer and the light blocking layer are integrated, or may have a form in which a plurality of layers formed for respective components are stacked. According to an embodiment, in the protective layer 202, a second hole 207 may be located in a position corresponding to the first hole 204 of the digitizer 203.

The heat radiating layer 205 may be located between the display device 201 and the battery 206. The heat radiating layer 205 may include a component (e.g., a copper layer) that performs a heat radiating function.

The fingerprint sensor 300 may be located to correspond to the first hole 204 of the digitizer 203. According to an embodiment, the fingerprint sensor 300 may obtain fingerprint information input to the display device 201 through the second hole 207 of the protective layer 202 and the first hole 204 of the digitizer 203. According to an embodiment, the fingerprint sensor 300 may be an optical, capacitive, or ultrasonic fingerprint sensor. According to an embodiment, in a case in which the fingerprint sensor 300 is an optical fingerprint sensor, the fingerprint sensor 300 may capture a fingerprint image of a finger surface using a photo diode, or may obtain a fingerprint using a difference in light reflectance between ridges and valleys of the fingerprint. According to an embodiment, in a case in which the fingerprint sensor 300 is a capacitive fingerprint sensor, the fingerprint sensor 300 may obtain a fingerprint using a difference in capacitance between portions (ridges) where the fingerprint touches an electrode and portions (valleys) where the fingerprint does not touch the electrode. According to an embodiment, in a case in which the fingerprint sensor 300 is an ultrasonic fingerprint sensor, the fingerprint sensor 300 may generate ultrasonic waves using piezo and may obtain a fingerprint using ultrasonic reflectance of valleys and ridges of the fingerprint.

Hereinafter, the following description is made under the assumption that the fingerprint sensor 300 is an optical fingerprint sensor according to an embodiment. According to an embodiment, when a user's finger makes contact with a fingerprint sensing region on the display device 201, the electronic device 200 may increase the brightness of the pixels disposed in the display device 201. Light emitted from the pixels may be reflected by the finger and may be input to the fingerprint sensor 300 through the first hole 204 and the second hole 207. The fingerprint sensor 300 may obtain fingerprint information of the finger, based on the input light.

According to an embodiment, the fingerprint sensor 300 may include a second FPCB 302 for the digitizer 203 and a third FPCB 303 for the fingerprint sensor 300. The second FPCB 302 may include a second conductive pattern for the digitizer 203. The third FPCB 303 may include a third conductive pattern for the fingerprint sensor 300. According to an embodiment, the second conductive pattern included in the fingerprint sensor 300 may be electrically connected, directly or indirectly, with the first conductive pattern included in the digitizer 203.

According to an embodiment, likewise to the first conductive pattern, the second conductive pattern may form a corresponding current (or, voltage) in response to a change in the intensity of a magnetic field generated by an electromagnetic signal transmitted from the input device. The digitizer 203 may sense the position of the input device on the display by sensing a change in the intensity of a magnetic field formed by the second conductive pattern. The second conductive pattern may be located to correspond to the first hole 204 of the digitizer 203. The digitizer 203 may sense the input device located on the region of the display device 201 that corresponds to the first hole 204 of the digitizer 203, by using the second conductive pattern of the fingerprint sensor 300. That is, the second conductive pattern of the fingerprint sensor 300 may prevent or reduce degradation in the performance of the digitizer 203 due to the absence of the first conductive pattern in the first hole 204.

According to an embodiment, the second conductive pattern may be formed of a plurality of conductive layers. The second conductive pattern may include a fourth plurality of conductive lines disposed perpendicular to a plurality of third conductive lines.

The electronic device according to the example embodiment may improve input device sensing performance of the digitizer using the second conductive pattern for the digitizer that is included in the fingerprint sensor and may maintain the performance of the fingerprint sensor by mounting the fingerprint sensor in the electronic device while maintaining an air gap having a predetermined value or more between the fingerprint sensor and the display device and maintaining an air gap having a predetermined value or more between the fingerprint sensor and the battery.

Hereinafter, a structure of the fingerprint sensor 300 of the electronic device according to an example embodiment will be described with reference to FIG. 3.

Figure 3:
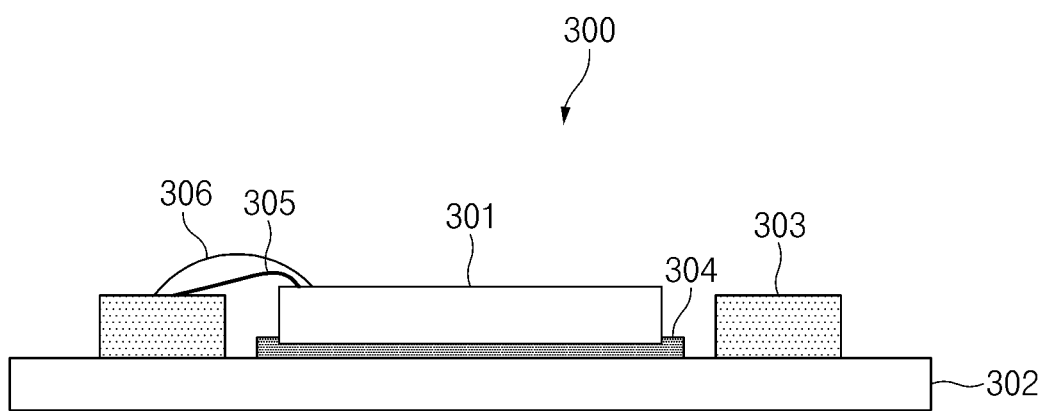
FIG. 3 is a schematic view illustrating a fingerprint sensor of the electronic device of FIG. 2.

FIG. 3 is a schematic view illustrating the fingerprint sensor 300 of the electronic device 200 of FIG. 2. Components identical to those in the above-described embodiment may be assigned with identical reference numerals, and descriptions thereabout may be omitted.

Referring to FIG. 3, the fingerprint sensor 300 may include a sensing unit 301, the second FPCB 302 for the digitizer (e.g., the digitizer 203 of FIG. 2), and the third FPCB 303 for the fingerprint sensor.

According to an embodiment, the sensing unit 301 may include a photo sensor and may obtain fingerprint information input to the display device (e.g., the display device 201 of FIG. 2). According to an embodiment, in a case in which the fingerprint sensor 300 is an optical fingerprint sensor, when the user's finger makes contact with the fingerprint sensing region on the display device, the electronic device (e.g., the electronic device 200) may increase the brightness of the pixels disposed in the display device, and the sensing unit 301 may sense light emitted from the pixels and input to the sensing unit 301 after reflected by the finger and may obtain fingerprint information of the finger.

According to an embodiment, the second FPCB 302 for the digitizer may include the second conductive pattern for the digitizer. According to an embodiment, the second conductive pattern included in the fingerprint sensor 300 may be electrically connected, directly or indirectly, with the first conductive pattern of the digitizer (e.g., the digitizer 203 of FIG. 2). According to an embodiment, likewise to the first conductive pattern, the second conductive pattern may form a corresponding current (or, voltage) depending on a change in the intensity of a magnetic field generated by an electromagnetic signal transmitted from the input device, and the digitizer may sense the position of the input device on the display by sensing a change in the intensity of a magnetic field formed by the second conductive pattern.

The third FPCB 303 for the fingerprint sensor may include the third conductive pattern for the fingerprint sensor 300. The third conductive pattern may convert the light input through the sensing unit 301 into a current (or, voltage) signal and/or may transfer the current (or, voltage) signal to a processor (e.g., the processor 120 of FIG. 1).

The sensing unit 301 and the second FPCB 302 may be attached to each other through an adhesive 304, and the sensing unit 301 and the third FPCB 303 may be bonded to each other through a wire 305. A resin 306 for protection of the wire 305 may be located on the wire (305) portion.

Hereinafter, a method of manufacturing the fingerprint sensor included in the electronic device according to an example embodiment will be described with reference to FIGS. 3, 4A, 4B, and 5. Components identical to those in the above-described embodiment may be assigned with identical reference numerals, and descriptions thereabout may be omitted.

Figure 4A:
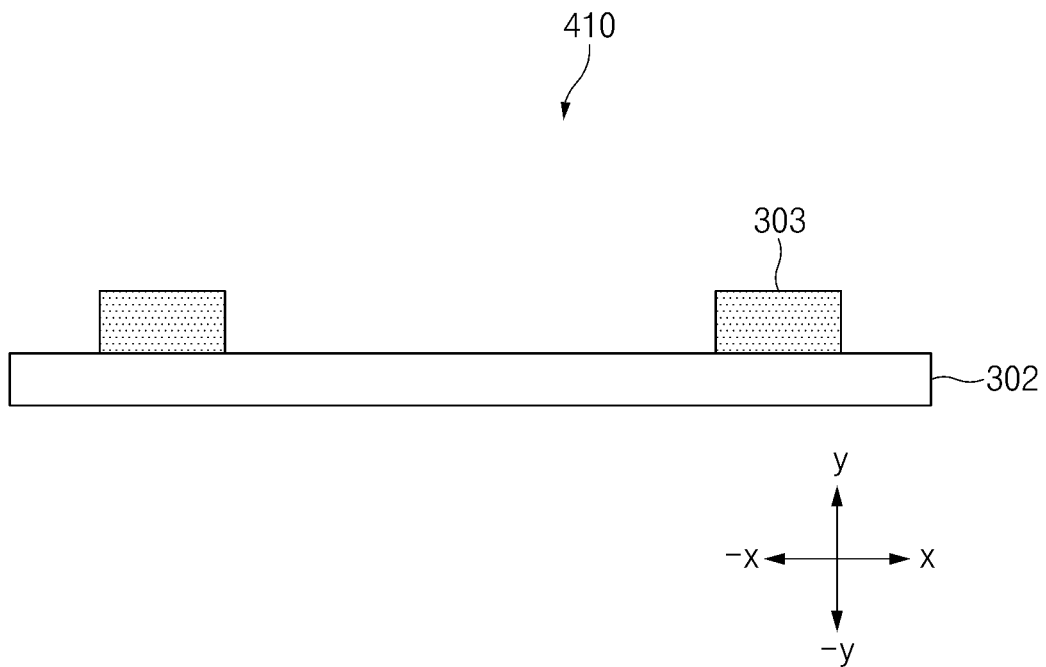
FIGS. 4A, 4B, and 5 are schematic views illustrating a method of manufacturing the fingerprint sensor included in the electronic device according to an example embodiment.
Figure 4B:
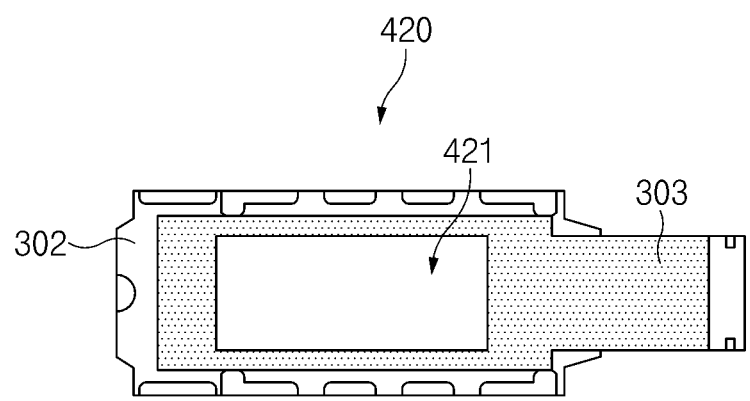
Figure 5:
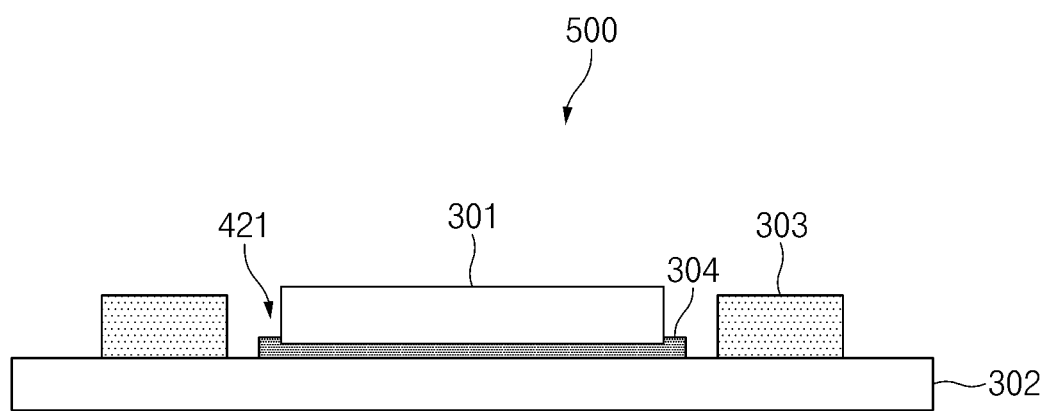

FIGS. 4A, 4B, and 5 are schematic views illustrating the method of manufacturing the fingerprint sensor included in the electronic device according to the example embodiment.

Referring to FIG. 4A, a sectional view 410 of FIG. 4A may represent a sectional view of a part for manufacturing the fingerprint sensor (e.g., the fingerprint sensor 300 of FIG. 2). The part for manufacturing the fingerprint sensor may have a structure in which the third FPCB 303 for the fingerprint sensor (e.g., the fingerprint sensor 300 of FIG. 2) is disposed on the second FPCB 302 for the digitizer (e.g., the digitizer 203 of FIG. 2) of the electronic device (e.g., the electronic device 200 of FIG. 2).

Referring to FIG. 4B, a plan view 420 of FIG. 4B may represent a plan view of the part for manufacturing the fingerprint sensor of FIG. 4A as viewed in the −y-axis direction. According to the plan view 420, the third FPCB 303 may have a structure including a third hole 421. Descriptions about the second FPCB 302 for the digitizer and the third FPCB 303 for the fingerprint sensor are identical to the contents described above with reference to FIGS. 2 and 3 and therefore will be omitted.

Referring to FIG. 5, the sensing unit 301 may be attached to the second FPCB 302 and the third FPCB 303 through the adhesive 304. According to an embodiment, the adhesive 304 may include an epoxy-type resin. According to an embodiment, the sensing unit 301 may be attached to the second FPCB 302 exposed through the third hole 421 of the third FPCB 303.

Referring again to FIG. 3, the sensing unit 301 may be electrically connected, directly or indirectly, with the third FPCB 303. According to an embodiment, the sensing unit 301 may be bonded to the third FPCB 303 through the wire 305. According to an embodiment, the resin 306 may be applied to the wire (305) portion to protect the wire 305 connecting the sensing unit 301 and the third FPCB 303. The fingerprint sensor 300 may be attached to a portion corresponding to the first hole (e.g., the first hole 204 of FIG. 2) of the digitizer (e.g., the digitizer 203 of FIG. 2) of the electronic device (e.g., the electronic device 200 of FIG. 2). The second conductive pattern of the second FPCB 302 of the fingerprint sensor 300 may be electrically connected, directly or indirectly, with the first conductive pattern of the digitizer.

Hereinafter, a method of electrically connecting the fingerprint sensor to the digitizer of the electronic device according to an example embodiment will be described with reference to FIG. 6. Components identical to those in the above-described embodiment may be assigned with identical reference numerals, and descriptions thereabout may be omitted.

Figure 6:
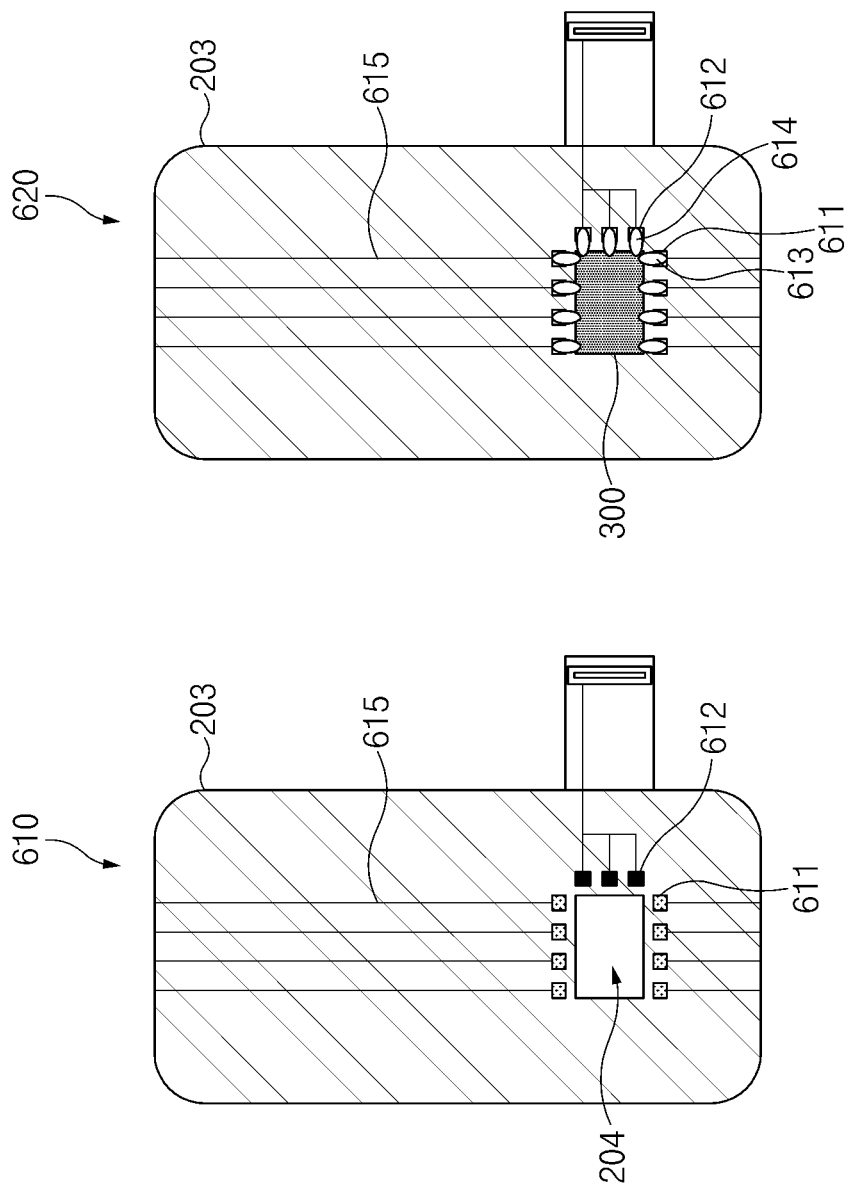
FIG. 6 is a view for describing a method of electrically connecting the fingerprint sensor to a digitizer of the electronic device according to the example embodiment.

FIG. 6 is a view for describing the method of electrically connecting the fingerprint sensor to the digitizer of the electronic device according to the example embodiment.

Referring to a first plan view 610 of FIG. 6, the electronic device (e.g., the electronic device 200 of FIG. 2) may include the digitizer 203. According to an embodiment, the first hole 204 may be located in the digitizer 203. According to an embodiment, the digitizer 203 may include a first conductive pattern 615. Detailed description about the digitizer 203 is identical to the contents described above with reference to FIGS. 2 and 3 and therefore will be omitted.

The digitizer 203 may include a first connecting pad 611 and a second connecting pad 622. The connecting pads may refer to portions in which the conductive pattern of the digitizer 203 is open for connection with other components at portions where the conductive pattern is cut off.

Referring to a second plan view 620 of FIG. 6, the fingerprint sensor 300 may be located in the portion corresponding to the first hole 204 of the digitizer 203. According to an embodiment, the second conductive pattern of the second FPCB (e.g., the second FPCB 302 of FIG. 3) of the fingerprint sensor 300 may be electrically connected with the first conductive pattern 615 of the digitizer 203 through the first connecting pad 611 of the digitizer 203. According to an embodiment, the second conductive pattern of the fingerprint sensor 300 may be electrically connected with the first conductive pattern 615 of the digitizer 203 by applying a solder ball 613 to the first connecting pad 611 through low-temperature soldering (e.g., jet soldering) such that the display is not damaged. According to an embodiment, the first conductive pattern 615 may be connected to the processor (e.g., the processor 120 of FIG. 1) of the electronic device.

According to an embodiment, the third conductive pattern of the third FPCB (e.g., the third FPCB 303 of FIG. 3) of the fingerprint sensor 303 may be electrically connected with the first conductive pattern 615 of the digitizer 203 through the second connecting pad 612 of the digitizer 203. According to an embodiment, the third conductive pattern of the fingerprint sensor 300 may be electrically connected with the first conductive pattern 615 of the digitizer 203 by applying a solder ball 614 to the second connecting pad 611 through soldering (e.g., jet soldering).

By integrating the second conductive pattern for the digitizer with the fingerprint sensor 300 and attaching the fingerprint sensor 300 to the portion corresponding to the first hole 204 of the digitizer 203, the electronic device according to the example embodiment may improve an ability to identify an input of the input device corresponding to the first hole (204) region of the digitizer 203, and the electronic device having the fingerprint sensor 300 attached thereto may be implemented while a predetermined gap is maintained between the display device (e.g., the display device 201 of FIG. 2) and the fingerprint sensor 300 and a predetermined gap is maintained between the display device and the battery (e.g., the battery 206 of FIG. 2).

In the embodiment described with reference to FIG. 6, it has been described that the fingerprint sensor and the digitizer are electrically connected through the soldering (e.g., jet soldering). However, this is illustrative, and according to an embodiment, the fingerprint sensor and the digitizer may be electrically connected by using an anisotropic conductive film (ACF) and/or conductive epoxy.

Hereinafter, a method of manufacturing a fingerprint sensor included in an electronic device according to an example embodiment will be described with reference to FIGS. 7A, 7B, 8, and 9.

FIGS. 7A, 7B, 8, and 9 are schematic views illustrating the method of manufacturing the fingerprint sensor included in the electronic device according to the example embodiment.

Figure 7A:
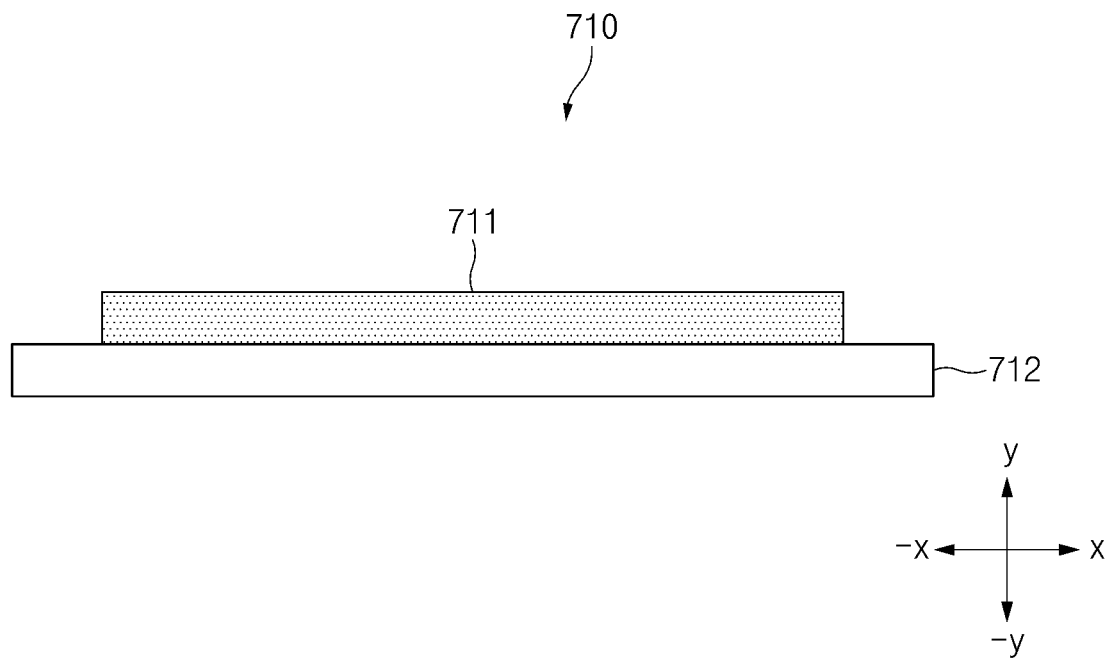
FIGS. 7A, 7B, 8, and 9 are schematic views illustrating a method of manufacturing a fingerprint sensor included in an electronic device according to an example embodiment.

Referring to FIG. 7A, a sectional view 710 of FIG. 7A may represent a sectional view of a part for manufacturing the fingerprint sensor (e.g., the fingerprint sensor 300 of FIG. 2). The part for manufacturing the fingerprint sensor may have a structure in which a third FPCB 711 for the fingerprint sensor (e.g., the fingerprint sensor 300 of FIG. 2) is disposed on a second FPCB 712 for a digitizer (e.g., the digitizer 203 of FIG. 2) of the electronic device (e.g., the electronic device 200 of FIG. 2).

According to an embodiment, the second FPCB 712 may be a circuit board (e.g., a second circuit board) for recognizing an input of an input device (e.g., a digitizer pen). For example, the second FPCB 712 may be a capacitive flexible printed circuit board (CAP-FPCB) or a capacitive printed circuit board (CAP-PCB) for sensing the input device.

According to an embodiment, a sensing unit (e.g., the sensing unit 301 of FIG. 3) for fingerprint recognition may be attached to the third FPCB 711.

Figure 7B:
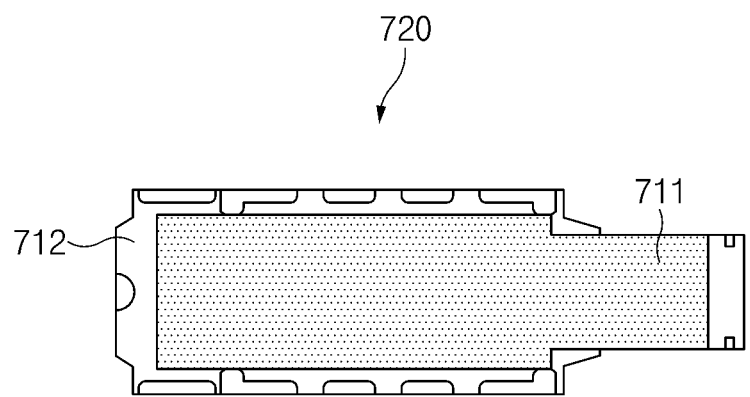

Referring to FIG. 7B, a plan view 720 of FIG. 7B may represent a plan view of the part for manufacturing the fingerprint sensor of FIG. 7A as viewed in the −y-axis direction. Descriptions about the second FPCB 712 for the digitizer and the third FPCB 711 for the fingerprint sensor are identical to the contents described above with reference to FIGS. 2 and 3 and therefore will be omitted.

Figure 8:
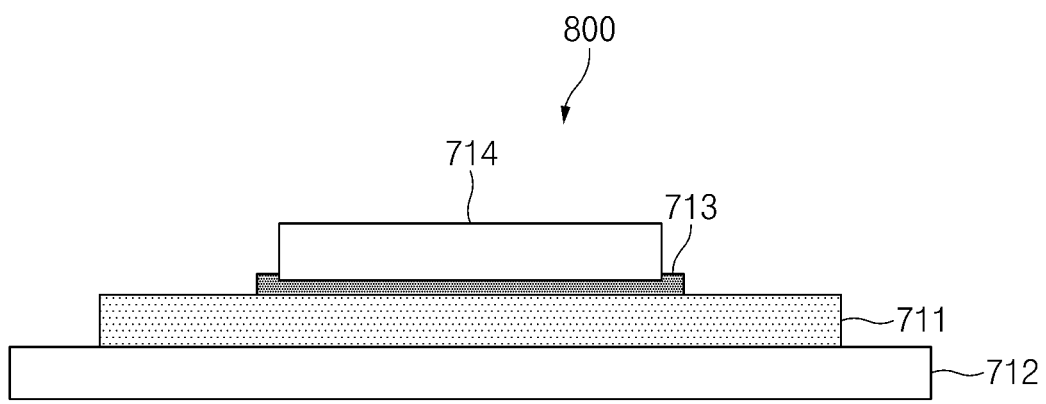

Referring to FIG. 8, a sensing unit 714 may be attached to the third FPCB 711 through an adhesive 713. According to an embodiment, the adhesive 713 may include an epoxy-type resin.

Figure 9:
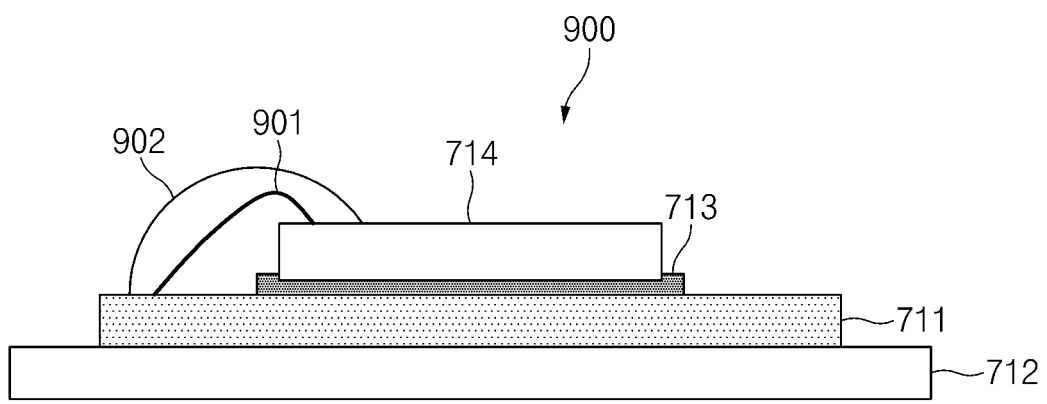

Referring to FIG. 9, the sensing unit 714 may be electrically connected with the third FPCB 711. According to an embodiment, the sensing unit 714 may be bonded to the third FPCB 711 through a wire 901. According to an embodiment, a resin 902 may be applied to the wire (901) portion to protect the wire 901 connecting the sensing unit 714 and the third FPCB 711. The fingerprint sensor 900 of FIG. 9 may be attached to a portion corresponding to a first hole (e.g., the first hole 204 of FIG. 2) of the digitizer (e.g., the digitizer 203 of FIG. 2) of the electronic device (e.g., the electronic device 200 of FIG. 2). A second conductive pattern of the second FPCB 712 of the fingerprint sensor 900 may be electrically connected with a first conductive pattern of the digitizer.

Hereinafter, an electronic device according to an example embodiment will be described with reference to FIGS. 10 and 11.

Figure 10:
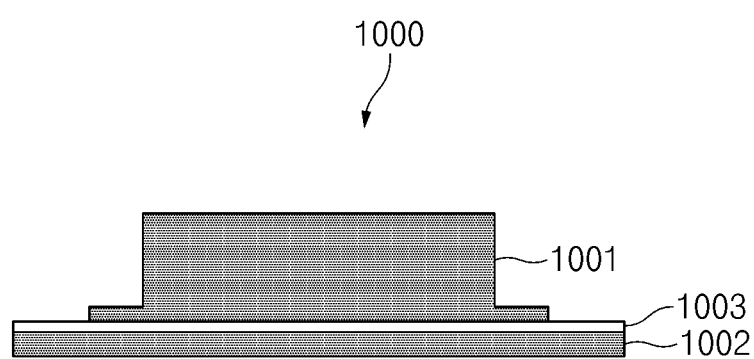
FIG. 10 is a schematic view illustrating a fingerprint sensor included in an electronic device according to an example embodiment.

FIG. 10 is a schematic view illustrating a fingerprint sensor 1000 included in the electronic device according to an example embodiment. FIG. 11 is a sectional view of the electronic device 1100, where FIG. 11 illustrates a portion of a stacked structure of the electronic device according to an example embodiment.

Referring to FIG. 10, the fingerprint sensor 1000 may include a sensing unit 1001 and a third FPCB 1002 for the fingerprint sensor.

Figure 11:
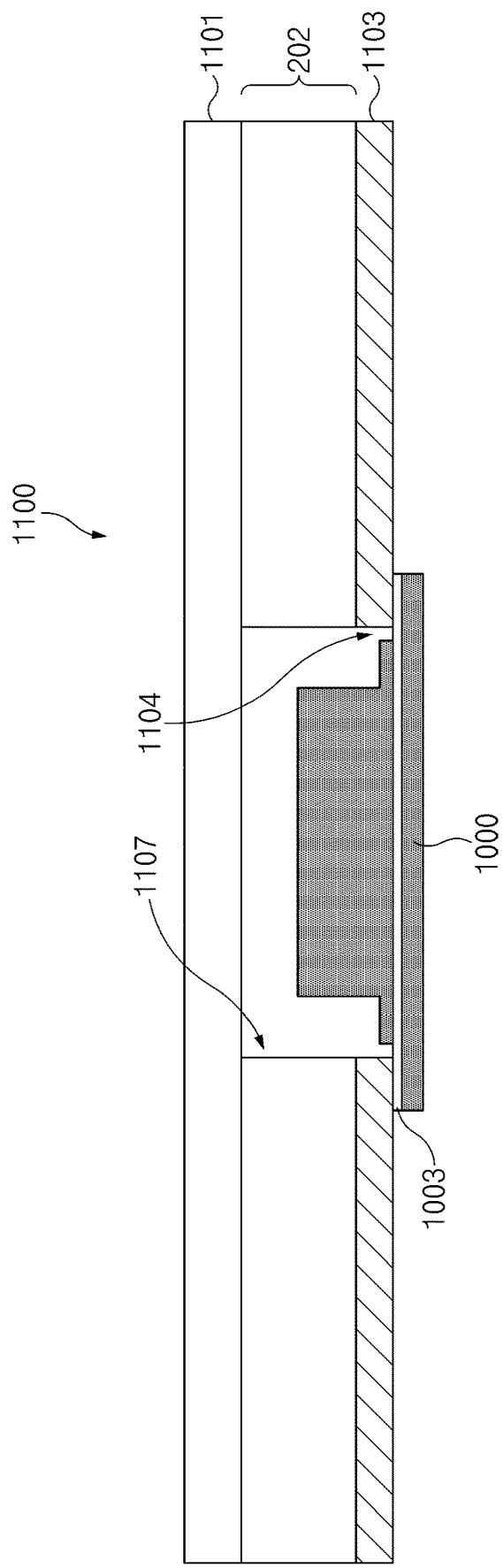
FIG. 11 is a sectional view of the electronic device, where

Referring to FIGS. 10 and 11, according to an embodiment, the sensing unit 1001 may include a photo sensor and may obtain fingerprint information input to a display device 1101. According to an embodiment, in a case in which the fingerprint sensor 1000 is an optical fingerprint sensor, when a user's finger makes contact with a fingerprint sensing region on the display device 1101, the electronic device 1100 (e.g., the electronic device 101) may increase the brightness of pixels disposed in the display device 1101, and the sensing unit 1001 may sense light emitted from the pixels and input to the sensing unit 1001 after reflected by the finger and may obtain fingerprint information of the finger.

The third FPCB 1002 for the fingerprint sensor 1000 may include a third conductive pattern for the fingerprint sensor 1000. The third conductive pattern may convert the light input through the sensing unit 1001 into a current (or, voltage) signal and/or may transfer the current (or, voltage) signal to a processor (e.g., the processor 120 of FIG. 1). According to an embodiment, at least a portion of a metal layer 1003 of the third FPCB 1002 may be exposed through an opening.

Referring to FIG. 11, the electronic device 1100 may include the display device 1101 (e.g., the display device 160 of FIG. 1), a protective layer 1102, and a heat radiating layer 1103. Descriptions about the display device 1101, the protective layer 1102, and the heat radiating layer 1103 are identical to the contents described above with reference to FIG. 2 and therefore will be omitted.

According to an embodiment, in the heat radiating layer 1103, a first hole 1104 may be located in a position corresponding to the fingerprint sensor 1000. According to an embodiment, in the protective layer 1102, a second hole 1107 may be located in a position corresponding to the first hole 1104 of the heat radiating layer 1103.

According to an embodiment, the fingerprint sensor 1000 may be located to correspond to the first hole 1104 of the heat radiating layer 1103. According to an embodiment, the fingerprint sensor 1000 may obtain fingerprint information input to the display device 1101 through the second hole 1107 of the protective layer 1102 and the first hole 1104 of the heat radiating layer 1103.

According to an embodiment, the exposed metal layer 1003 of the fingerprint sensor 1000 may be electrically connected with the heat radiating layer 1103. Since the heat radiating layer 1103 cannot be located in the region in which the first hole 104 is located, heat radiating performance may be deteriorated due to heat transfer interruption. However, heat radiating performance may be secured by connecting interrupted heat transfer through the metal layer 1003 in the fingerprint sensor 1000.

Hereinafter, an electronic device according to an example embodiment will be described with reference to FIGS. 12, 13, and 14.

Figure 12:
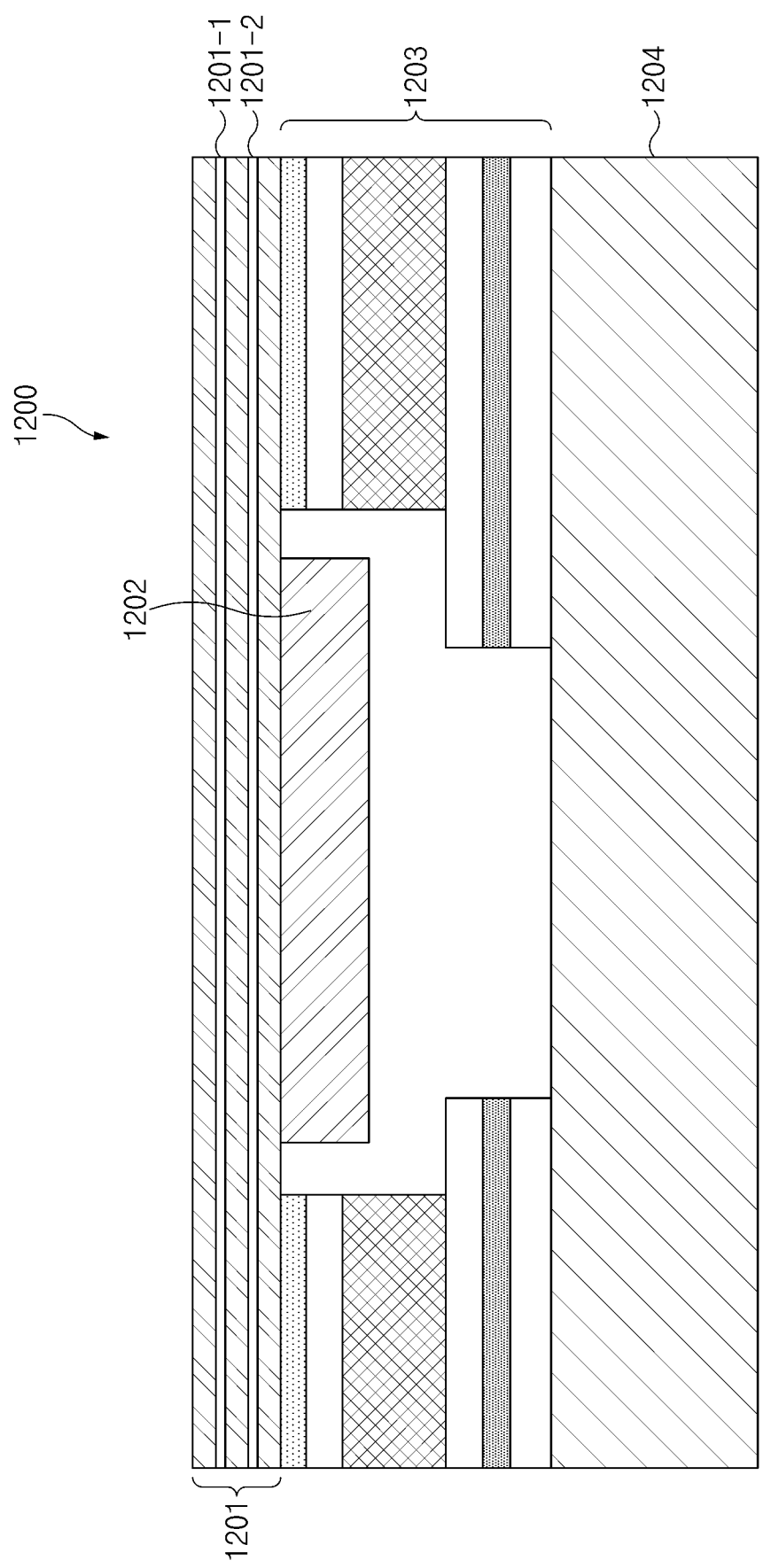
FIG. 12 is a sectional view of an electronic device, where

FIG. 12 is a sectional view of the electronic device 1200, where FIG. 12 illustrates a portion of a stacked structure of the electronic device according to an example embodiment. FIG. 13 is a schematic view illustrating a digitizer 1300 included in the electronic device according to an example embodiment. FIG. 14 is a sectional view 1400 of the digitizer taken along line I-I' of FIG. 13.

Referring to FIG. 12, the electronic device 1200 may include a digitizer 1201, a sensing unit 1202, a protective layer 1203, and a display device 1204 (e.g., the display device 160 of FIG. 1).

According to an embodiment, the digitizer 1201 of the electronic device 1200 may include a first FPCB 1201-1 for the digitizer. The first FPCB 1201-1 may include a first conductive pattern. Description about the first conductive pattern is identical to the contents described above with reference to FIGS. 2 and 3 and therefore will be omitted. According to an embodiment, the digitizer 1201 may not include a hole, and accordingly, the first conductive pattern may be disposed on a front surface of the digitizer 1201 irrespective of a hole.

According to an embodiment, the digitizer 1201 of the electronic device 1200 may include a third FPCB 1201-2 for a fingerprint sensor. The third FPCB 1201-2 may include a third conductive pattern. Description about the third conductive pattern is identical to the contents described above with reference to FIGS. 2 and 3 and therefore will be omitted. According to an embodiment, the third conductive pattern of the digitizer 1201 may be electrically connected with the sensing unit 1202.

According to an embodiment, the sensing unit 1202 may include a photo sensor for an optical fingerprint sensor and may be electrically connected with the third conductive pattern of the digitizer 1201. Electrical connection of the third conductive pattern of the digitizer 1201 and the sensing unit 1202 according to an embodiment will be described in detail with reference to FIGS. 13 and 14.

The protective layer 1203 according to an embodiment may include at least one of a buffer layer (e.g., a cushion layer or a sponge layer) for absorbing impact, a light blocking layer (e.g., a black sheet or a light blocking member layer of a black printed layer) for blocking light, or an adhesive layer for adhesion. The protective layer 1203 may be configured in an integral form in which the buffer layer, the light blocking layer, and the adhesive layer are integrated, or may have a form in which a plurality of layers formed for respective components are stacked.

Description about the display device 1204 is identical to the contents described above with reference to FIG. 2 and therefore will be omitted.

Figure 13:
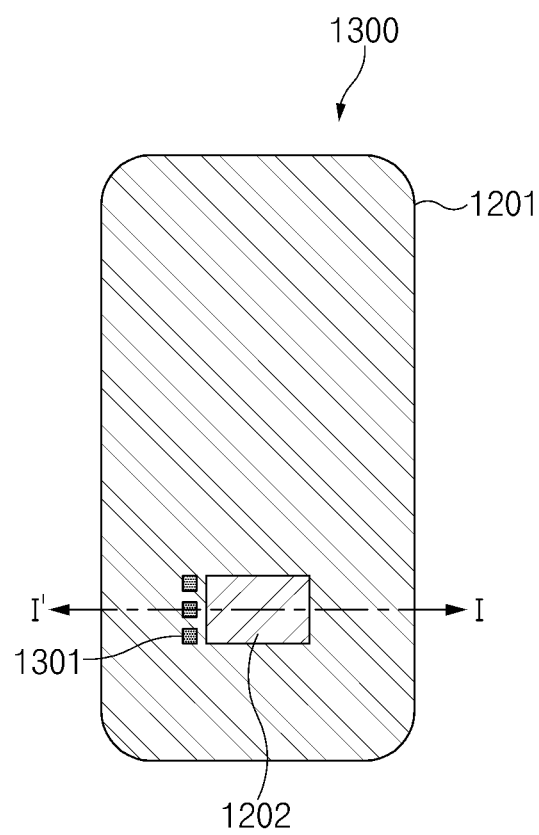
FIG. 13 is a schematic view illustrating a digitizer included in the electronic device according to an example embodiment.
Figure 14:
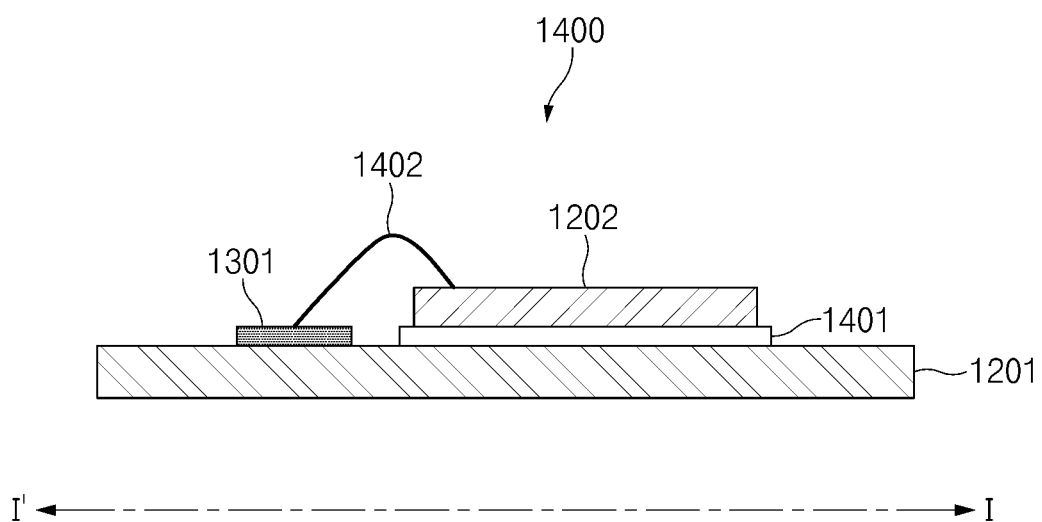
FIG. 14 is a sectional view of the digitizer taken along line I-I' of FIG. 13.

Referring to FIGS. 13 and 14, the sensing unit 1202 may be attached to one surface of the digitizer 1201 through an adhesive 1401. According to an embodiment, the adhesive 1401 may include an epoxy-type resin.

According to an embodiment, the digitizer 1201 may include a connecting pad 1301 for the fingerprint sensor. According to an embodiment, the sensing unit 1202 and the connecting pad 1301 may be bonded and electrically connected to each other through a wire 1402.

According to an embodiment, by attaching the sensing unit 1202 to the one surface of the digitizer 1201, the digitizer 1201 may be affected, and therefore, when a user uses the fingerprint sensor, a processor of the electronic device may stop the use of the digitizer 1201 and wireless charging operation of an input device (not illustrated) (e.g., a stylus pen) to avoid mutual interference.

Hereinafter, an electronic device according to an example embodiment will be described with reference to FIGS. 12, 15, and 16.

Figure 15:
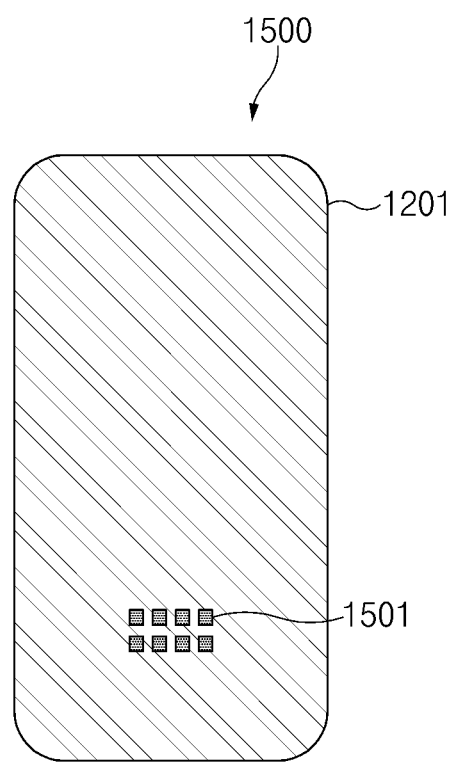
FIG. 15 is a schematic view illustrating a digitizer included in an electronic device according to an example embodiment.

FIG. 15 is a schematic view illustrating a digitizer 1500 included in the electronic device according to an example embodiment. FIG. 16 is a schematic sectional view 1600 illustrating a state in which a sensing unit is attached to the digitizer included in the electronic device according to an example embodiment.

Referring to FIG. 12, the electronic device 1200 may include a digitizer 1201, the sensing unit 1202, a protective layer 1203, and a display device 1204 (e.g., the display device 160 of FIG. 1). Descriptions about the digitizer 1201, the sensing unit 1202, the protective layer 1203, and the display device 1204 are identical to the contents described above with reference to FIG. 12 and therefore will be omitted.

Referring to FIG. 13, according to an embodiment, the digitizer 1201 of the electronic device 1200 may include a first FPCB for the digitizer. The first FPCB may include a first conductive pattern. Description about the first conductive pattern is identical to the contents described above with reference to FIGS. 2 and 3 and therefore will be omitted. According to an embodiment, the digitizer 1201 may not include a hole, and accordingly, the first conductive pattern may be disposed on a front surface of the digitizer 1201 irrespective of a hole.

According to an embodiment, the digitizer 1201 of the electronic device 1200 may include a third FPCB for a fingerprint sensor. The third FPCB may include a third conductive pattern. Description about the third conductive pattern is identical to the contents described above with reference to FIGS. 2 and 3 and therefore will be omitted.

According to an embodiment, the digitizer 1201 of the electronic device 1200 may include a connecting pad 1501 for the fingerprint sensor.

Figure 16:
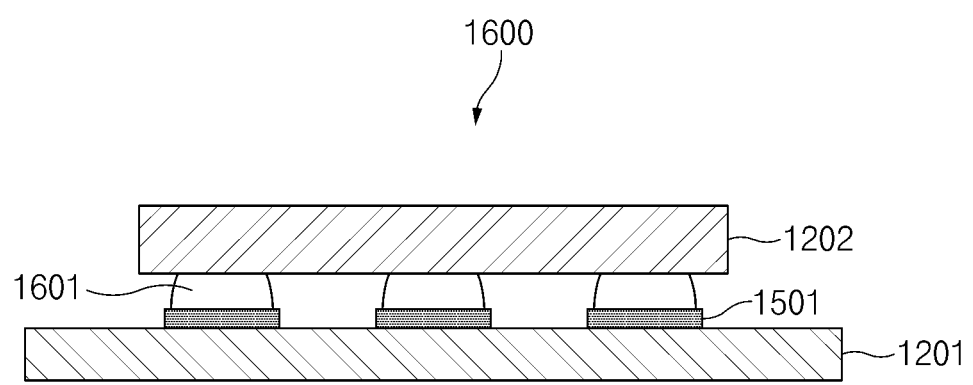
FIG. 16 is a schematic sectional view illustrating a state in which a sensing unit is attached to the digitizer included in the electronic device according to an example embodiment.

Referring to FIG. 16, according to an embodiment, the sensing unit 1202 and the connecting pad 1501 of the digitizer 1201 may be electrically connected. According to an embodiment, the sensing unit 1202 and the third conductive pattern of the digitizer 1201 may be electrically connected by applying a solder ball 1601 to the connecting pad 1501 through soldering (e.g., jet soldering).

An electronic device according to an example embodiment may include a display device, a battery, a digitizer that is located between the display device and the battery and that includes a first circuit board, a fingerprint sensor including a second circuit board and a third circuit board, and a processor (comprising processing circuitry) electrically connected to the display device, the digitizer, and the fingerprint sensor. The first circuit board may include a first conductive pattern for recognition of an input device, the second circuit board may include a second conductive pattern for recognition of the input device, the third circuit board may include a third conductive pattern for recognition of a fingerprint, and the first conductive pattern and the second conductive pattern may be electrically connected.

According to an example embodiment, the first conductive pattern of the digitizer and the second conductive pattern of the fingerprint sensor may be electrically connected through a connecting pad of the digitizer.

According to an example embodiment, the connecting pad and the second conductive pattern may be electrically connected through a solder ball.

According to an example embodiment, a photo sensor of the fingerprint sensor may be electrically connected with the third conductive pattern of the fingerprint sensor through a wire.

According to an example embodiment, the digitizer may further include a first hole without the first conductive pattern.

According to an example embodiment, the fingerprint sensor may be located in a region corresponding to the first hole.

A fingerprint sensor according to an example embodiment may include a photo sensor, a first circuit board, and a second circuit board. The first circuit board may include a first conductive pattern for recognition of an input device, and the second circuit board may include a second conductive pattern for recognition of a fingerprint.

According to an example embodiment, the first circuit board may include the first conductive pattern for recognition of the input device being a digital pen.

According to an example embodiment, the photo sensor may be electrically connected with the second conductive pattern.

According to an example embodiment, the photo sensor may be electrically connected with the second conductive pattern through a wire.

According to an example embodiment, the second circuit board may be located on one surface of the first circuit board.

According to an example embodiment, the photo sensor may be located on one surface of the first circuit board or the second circuit board.

An electronic device according to an example embodiment may include a display device, a battery, a heat radiating layer located between the display device and the battery, a fingerprint sensor including a circuit board, and a processor electrically connected to the display device and the fingerprint sensor. The circuit board may include a conductive pattern for recognition of a fingerprint, the circuit board may include an opening through which at least a portion of a metal layer included in the circuit board is exposed, and the metal layer exposed through the opening may be electrically connected with the heat radiating layer.

According to an example embodiment, a photo sensor of the fingerprint sensor may be electrically connected with the conductive pattern of the fingerprint sensor through a wire.

According to an example embodiment, the heat radiating layer may further include a first hole.

According to an example embodiment, the fingerprint sensor may be located in a region corresponding to the first hole.

An electronic device according to an example embodiment may include a display device, a battery, a digitizer that is located between the display device and the battery and that includes a first circuit board and a second circuit board, a fingerprint sensor including a photo sensor, and a processor electrically connected to the display device, the digitizer, and the fingerprint sensor. The first circuit board may include a first conductive pattern for recognition of an input device, the second circuit board may include a second conductive pattern for recognition of a fingerprint, and the second conductive pattern and the photo sensor may be electrically connected.

According to an example embodiment, the second conductive pattern of the digitizer and the photo sensor may be electrically connected through a connecting pad of the digitizer.

According to an example embodiment, the connecting pad and the photo sensor may be electrically connected through a solder ball.

According to an example embodiment, the connecting pad and the photo sensor may be electrically connected through a wire.

While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

The invention claimed is:

1. An electronic device comprising:
a display device comprising a display;
a battery;
a digitizer located between at least the display device and the battery, the digitizer including a first circuit board;
a fingerprint sensor including a second circuit board and a third circuit board; and
a processor electrically connected to the display device, the digitizer, and the fingerprint sensor,
wherein the first circuit board includes a first conductive pattern for recognition of an input device, the second circuit board includes a second conductive pattern for recognition of the input device, the third circuit board includes a third conductive pattern for recognition of a fingerprint, and the first conductive pattern and the second conductive pattern are electrically connected.

2. The electronic device of claim 1, wherein the first conductive pattern of the digitizer and the second conductive pattern of the fingerprint sensor are electrically connected through at least a connecting pad of the digitizer.

3. The electronic device of claim 2, wherein the connecting pad and the second conductive pattern are electrically connected through at least a solder ball.

4. The electronic device of claim 1, wherein a photo sensor of the fingerprint sensor is electrically connected with the third conductive pattern of the fingerprint sensor through at least a wire.

5. The electronic device of claim 1, wherein the digitizer further includes a first hole without the first conductive pattern.

6. The electronic device of claim 5, wherein the fingerprint sensor at least partially overlaps the first hole.

7. A fingerprint sensor comprising:
a photo sensor;
a first circuit board; and
a second circuit board,
wherein the first circuit board includes a first conductive pattern for recognition of an input device, and the second circuit board includes a second conductive pattern for recognition of a fingerprint, and
wherein the second circuit board is located between at least the first circuit board and the photo sensor.

8. The fingerprint sensor of claim 7, wherein the first circuit board includes the first conductive pattern for recognition of the input device comprising a digital pen.

9. The fingerprint sensor of claim 7, wherein the photo sensor is electrically connected with the second conductive pattern.

10. The fingerprint sensor of claim 7, wherein the photo sensor is electrically connected with the second conductive pattern through at least a wire.

11. The fingerprint sensor of claim 7, wherein the second circuit board is located on one surface of the first circuit board.

12. The fingerprint sensor of claim 7, wherein the photo sensor is located on one surface of the second circuit board.

13. An electronic device comprising:
a display device comprising a display;
a battery;
a heat radiating layer located between at least the display device and the battery;
a fingerprint sensor including a circuit board; and
a processor electrically connected to the display device and the fingerprint sensor,
wherein the circuit board includes a conductive pattern for recognition of a fingerprint, the circuit board includes an opening through which at least a portion of a conductive metal inclusive layer included in the circuit board is exposed, and the conductive metal inclusive layer exposed through the opening is electrically connected with the heat radiating layer.

14. The electronic device of claim 13, wherein a photo sensor of the fingerprint sensor is electrically connected with the conductive pattern of the fingerprint sensor through at least a wire.

15. The electronic device of claim 13, wherein the heat radiating layer further includes a first hole.

* * * * *